United States Patent
Kim

(10) Patent No.: US 9,886,339 B2
(45) Date of Patent: Feb. 6, 2018

(54) SEMICONDUCTOR DEVICE USING FUSE ARRAYS TO STORE WEAK CELL ADDRESSES

(71) Applicant: SK hynix Inc., Icheon-si Gyeonggi-do (KR)

(72) Inventor: Jong Sam Kim, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/244,363

(22) Filed: Aug. 23, 2016

(65) Prior Publication Data

US 2017/0269989 A1    Sep. 21, 2017

(30) Foreign Application Priority Data

Mar. 17, 2016  (KR) .................. 10-2016-0032267

(51) Int. Cl.
*G06F 11/07*    (2006.01)
*G11C 29/00*   (2006.01)
(Continued)

(52) U.S. Cl.
CPC ........ *G06F 11/0793* (2013.01); *G06F 11/073* (2013.01); *G06F 11/079* (2013.01);
(Continued)

(58) Field of Classification Search
CPC .. G06F 11/0793; G06F 11/079; G06F 11/073; G06F 11/0751; G11C 17/16; G11C 11/406; G11C 29/76
See application file for complete search history.

(56) References Cited

U.S. PATENT DOCUMENTS 7,162,668 B2 *   1/2007   Roohparvar ........... G11C 29/82
                                                       714/710
7,230,870 B2 *   6/2007   Takai .................... G11C 11/406
                                                       365/200
(Continued)

FOREIGN PATENT DOCUMENTS

KR         1020140125981 A      10/2014

*Primary Examiner* — Vanthu Nguyen
*Assistant Examiner* — Jerome Leboeuf
(74) *Attorney, Agent, or Firm* — William Park & Associates Ltd.

(57) ABSTRACT

A semiconductor device may include normal memory cells, redundancy memory cells, a fuse array, and a controller. The normal memory cells may be coupled to a plurality of word lines and bit lines. The redundancy memory cells may be coupled to a plurality of word lines and bit lines, and may replace one or more normal memory cells that are defective. The fuse array may include a redundancy address storage region configured to store addresses of the redundancy memory cells, an error correction information storage region configured to store error correction information for correcting errors of addresses of the redundancy memory cells, stored in the redundancy address storage region, and a weak address storage region configured to store an address of a weak cell among the normal memory cells. The controller may perform a repair operation based on a redundancy address and perform a refresh operation on a weak cell corresponding to the address of the weak cell.

17 Claims, 5 Drawing Sheets

(51) Int. Cl.
*G11C 11/406* (2006.01)
*G11C 17/16* (2006.01)

(52) U.S. Cl.
CPC ........ *G06F 11/0751* (2013.01); *G11C 11/406* (2013.01); *G11C 17/16* (2013.01); *G11C 29/76* (2013.01)

(56) References Cited

U.S. PATENT DOCUMENTS

| | | | | |
|---|---|---|---|---|
| 2009/0021999 | A1* | 1/2009 | Tanimura | G11C 7/222 |
| | | | | 365/200 |
| 2013/0279282 | A1* | 10/2013 | Kim | G11C 17/16 |
| | | | | 365/207 |
| 2014/0269123 | A1* | 9/2014 | Kim | G11C 11/40618 |
| | | | | 365/200 |
| 2014/0317469 | A1 | 10/2014 | Sohn et al. | |
| 2015/0348645 | A1* | 12/2015 | Kasorla | G11C 17/18 |
| | | | | 365/96 |

* cited by examiner

_US 9,886,339 B2_

SEMICONDUCTOR DEVICE USING FUSE ARRAYS TO STORE WEAK CELL ADDRESSES

CROSS-REFERENCES TO RELATED APPLICATION

The present application claims priority under 35 U.S.C. §119(a) to Korean application number 10-2016-0032267 filed on Mar. 17, 2016, in the Korean Intellectual Property Office, which is incorporated herein by reference in its entirety.

BACKGROUND

1. Technical Field

Various embodiments relate to a semiconductor device, and more particularly, a semiconductor device capable of efficiently performing a refresh operation.

2. Related Art

In general, a semiconductor device includes a large number of memory cells. As process technology continues to reduce dimensions and integration density increases, the number of memory cells included in a semiconductor device increases. The large number of memory cells in semiconductor devices may result in a significant probability that there will be at least one defective memory cell in every semiconductor device. Even if a semiconductor device has only one defective memory cell, however, the semiconductor device may malfunction.

To avoid the need to discard semiconductor devices having relatively few defective memory cells, techniques have been developed to repair memory cells. Therefore, in order to increase the yield of the product, the semiconductor device includes redundancy memory cells as well as normal memory cells.

The semiconductor device may include a redundancy control circuit. If defective memory cells are detected and marked as defective through a test procedure, the redundancy control circuit may connect redundant elements instead of the defective memory cells when an access request for the normal memory cell is made. The redundancy control circuit may replace the defective memory cell (hereafter "repair target memory cell") with a redundancy memory cell.

Specifically, when a request for accessing any of the repair target memory cells is made during a read/write operation, a redundancy memory cell may be accessed instead of the repair target memory cell.

Thus, even when accessing the address of the repair target memory cell (hereafter, referred to as "failed address"), a normal operation of the semiconductor device is guaranteed by accessing the redundancy memory cell instead of the repair target memory cell (hereafter, referred to as "repair operation").

Electrically programmable fuses such as Array Electrical-fuse ("ARE") may store (program) information by applying a high electric field to a gate of a transistor to rupture a gate dielectric layer. The electrically programmable fuses may be used to set a specific value determined during a semiconductor integrated circuit test process. In particular, the electrically programmable fuses may be used to store the address (hereafter, referred to as "redundancy address") of the redundancy memory cell replacing the failed address.

SUMMARY

In an embodiment of the present disclosure, a semiconductor device may include normal memory cells, redundancy memory cells, a fuse array, and a controller. The normal memory cells may be coupled to a plurality of word lines and bit lines. The redundancy memory cells may be coupled to a plurality of word lines and bit lines, and may replace one or more normal memory cells that are defective. The fuse array including a redundancy address storage region configured to store addresses of the redundancy memory cells, an error correction information storage region configured to store error correction information for correcting errors of addresses of the redundancy memory cells, stored in the redundancy address storage region, and a weak address storage region configured to store an address of a weak cell among the normal memory cells. The controller may perform a repair operation based on the addresses of the redundancy memory cells, stored in the redundancy address storage region, and may perform a refresh operation on a weak cell.

BRIEF DESCRIPTION OF THE DRAWINGS

Features, aspects, and embodiments are described in conjunction with the attached drawings, in which.

DETAILED DESCRIPTION

Figure 1:
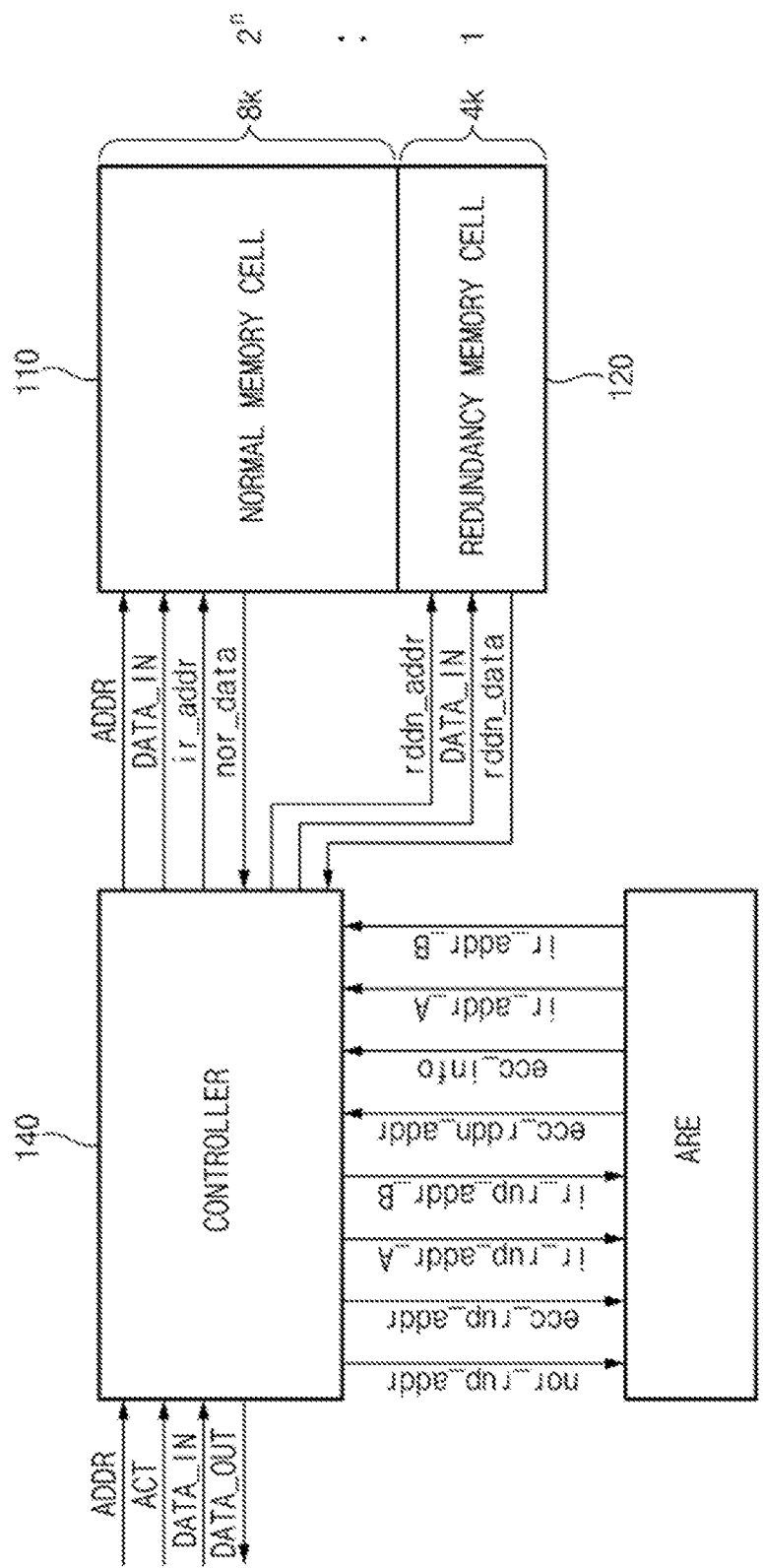
FIG. 1 is a diagram illustrating an example of a semiconductor device according to an embodiment.

Hereinafter, a semiconductor device according to the present disclosure will be described below with reference to the accompanying drawings through example embodiments.

A memory cell may include a capacitor to store information therein. The capacitor may be either charged or discharged, and these two states may represent the two values of a bit. The information stored in the capacitor may be lost unless the capacitor charge is refreshed. Thus, a refresh operation for recharging the capacitor needs to be performed.

When a progressive defect occurs in such a memory cell, however, the usual refresh operation may not be enough. In other words, unlike a defective memory cell marked as defective, a progressive defect that occurs, for example, due to a coupling phenomenon between adjacent cells may cause data loss if it occurs before the usual refresh operation is performed. A memory cell vulnerable to the progressive defect may be referred to as a "weak cell."

The weak cells may be repaired through a typical repair method. For example, the weak cells may be repaired if the semiconductor device has a sufficient number of redundancy memory cells. For example, redundancy memory cells may be additionally provided to replace (repair) the weak cell.

In this case, however, an increase in the number of the redundancy memory cells leads to an increase in the area of a chip and a decrease in the number of dies per wafer and the yield.

Furthermore, if redundancy addresses for repairing defective cells and addresses of weak cells are stored in substantially the same electrically programmable fuses (e.g., ARE), an address size of the weak cell may be limited to a redundancy address size due to the architecture of the ARE.

Hereafter, for convenience of description, a direction in which a plurality of word lines are arranged will be referred to as a column direction, and a direction in which a plurality of bit lines are arranged will be referred to as a row direction.

Each of word lines included in the ARE may has a substantially equal number of bit lines or substantially the same number of bits. Thus, when a redundancy address and an address of a weak cell are stored in substantially the same ARE, the redundancy address and the address of the weak cell may have substantially the same number of bits as each other.

However, since an address size of the redundancy memory cells in the column direction is smaller than an address size of the normal memory cells in the column direction, the redundancy address may have a smaller number of bits than the address of the weak cell. In this case, when the number of bits of the address of the weak cell is limited to the number of bits of the redundancy address, the weak cell cannot be correctly represented.

The weak cell may be correctly represented by increasing the address size of the AREs in the column direction (the number of bit lines, that is, the number of bits). In this case, however, an increase in the area of the chip may result in a decrease in yield.

In an embodiment of the present disclosure, a semiconductor device may correctly store addresses of weak cells without increasing the address size of memory cells for storing addresses, such as redundancy memory cells or ARE.

FIG. 1 is a diagram illustrating an example of a semiconductor device for performing an innovative refresh operation according to an embodiment.

Referring to FIG. 1, the semiconductor device according to an embodiment may include normal memory cells 110, redundancy memory cells 120, an array electrical-fuse ARE and a controller 140.

The normal memory cells 110 may store data of the semiconductor device. The normal memory cells 110 may include, for example, 8 k word lines arranged in the row direction and having a plurality of bit lines.

The redundancy memory cells 120 may replace memory cells that turn out to be defective and need to be repaired (replaced), among the normal memory cells 110. The memory cell marked as defective will be referred as a repair target memory cell. The redundancy memory cells 120 may include, for example, 4 k word lines arranged in the row direction and having substantially the same number of bit lines as the word lines of the normal memory cells 110.

The array electrical-fuse ARE may store addresses of redundancy cells and addresses of weak cells. An example architecture of the array electrical-fuse ARE will be described below.

The controller 140 may perform a repair operation and an innovative refresh operation using the array electrical-fuse ARE, and control input/output of data DATA_IN and DATA_OUT.

The repair operation of the controller 140 will be described in detail below.

When an input address ADDR for a normal memory cell 110 is determined to be a failed address (when an access signal for a defective memory cell is input), the controller 140 may generate an address of the array electrical-fuse ARE corresponding to the input address ADDR (e.g., a normal rupture address nor_rup_addr) in order to acquire a redundancy address ecc_rddn_addr corresponding to the input address ADDR. Thus, the controller 140 may acquire the redundancy address ecc_rddn_addr from the normal rupture address nor_rup_addr of the array electrical-fuse ARE. The controller 140 may access a redundancy memory cell 120 corresponding to the redundancy address ecc_rddn_addr, instead of accessing a defective cell or the normal memory cell 110, and may perform an operation according to an input active signal ACT.

Furthermore, when the input address ADDR is determined not to be a failed address or when an access signal for a normal memory cell is input, the controller 140 may access a normal memory cell 110 corresponding to the input address ADDR, and may perform an operation according to an input active signal ACT.

The innovative refresh operation of the controller 140 will be described in detail below.

The innovative refresh operation may indicate a refresh operation which is additionally performed on weak cells, in addition to a typical refresh operation which is performed on the normal memory cells 110 according to a preset timing.

Specifically, when an active signal ACT corresponding to a refresh operation is input, the controller 140 may perform a refresh operation on all of the normal memory cells 110. Furthermore, the controller 140 may additionally perform a refresh operation on weak cells, among the normal memory cells 110, by referring to the addresses ir_addr_A and ir_addr_B of the weak cells, which are stored in the array electrical-fuse ARE. Here, since the addresses of the weak cells are used for the innovative refresh operation, the addresses of the weak cells will be referred to as "IR addresses." That is, the controller 140 may generate IR rupture addresses ir_rup_addr_A and ir_rup_addr_B, which are addresses of the array electrical-fuse ARE for acquiring the IR addresses ir_addr_A and ir_addr_B. The controller 140 may perform an additional refresh operation on the normal memory cells 110 using the IR addresses ir_addr_A and ir_addr_B.

Furthermore, the controller 140 may input data DATA_IN to the normal memory cells 110 or the redundancy memory cells 120. The controller 140 may output data nor_data stored in the normal memory cells 110 or data rddn_data stored in the redundancy memory cell 120 as output data DATA_OUT.

Figure 2:
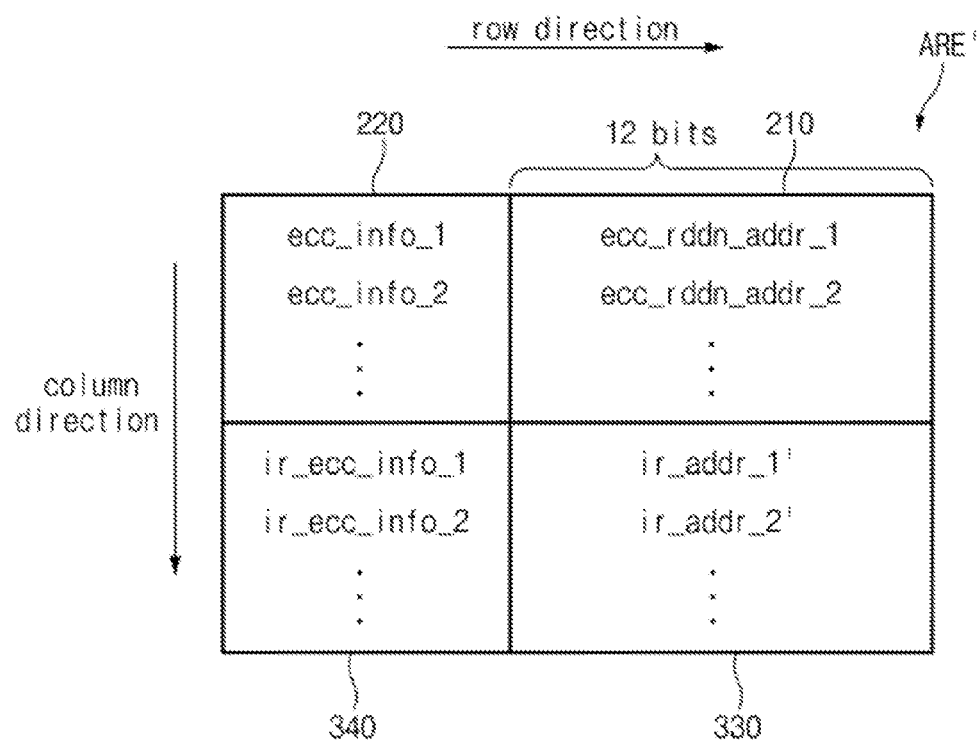
FIG. 2 is a diagram illustrating an example architecture of an array electrical-fuse of FIG. 1.

FIG. 2 is a diagram illustrating an example architecture of the array electrical-fuse ARE of FIG. 1.

The array electrical-fuse ARE' of FIG. 2 may include a redundancy address storage region 210, an Error Correction Code ("ECC") information storage region 220, an IR address storage region 330 (weak address storage region) and an IR ECC information storage region 340.

The redundancy address storage region 210 may store redundancy addresses ecc_rddn_addr_1 and ecc_rddn_addr_2 which are the addresses of the redundancy memory cells 120 for replacing defective memory cells in which a typical defect occurred (repair-target memory cells). The controller 140 may perform a repair operation using the redundancy addresses ecc_rddn_addr_1 and ecc_rddn_addr_2 stored in the redundancy address storage region 210.

For example, suppose that the normal memory cells 110 of FIG. 1 include 8 k word lines arranged in the row direction, and the redundancy memory cells 120 include 4 k word lines arranged in the row direction and having substantially the same number of bits as the word lines of the normal memory cells 110. Then, since $2^{12}$ is 4 k, twelve (12) bits may be required for the redundancy word lines ecc_rddn_addr_1 and ecc_rddn_addr_2. Thus, the address size (e.g., the number of address bits) of the redundancy address storage region 210 in the column direction may be set to twelve (12).

The ECC information storage region 220 may store ECC information ecc_info_1 and ecc_info_2 for correcting errors of the redundancy addresses ecc_rddn_addr_1 and ecc_rddn_addr_2 stored in the redundancy address storage region 210. For example, when the redundancy addresses ecc_rddn_addr_1 and ecc_rddn_addr_2 are set to twelve (12) bits, the corresponding ECC information ecc_info_1 and ecc_info_2 can be set to five (5) bits. The controller 140 may correct errors of the redundancy addresses ecc_rddn_addr_1 and ecc_rddn_addr_2 using the ECC information ecc_info_1 and ecc_info_2, and may output the corrected redundancy addresses rddn_addr to the redundancy memory cells 120.

The errors of the redundancy addresses ecc_rddn_addr_1 and ecc_rddn_addr_2 may be corrected as follows. The controller 140 may generate the ECC information ecc_info_1 and ecc_info_2 using the redundancy addresses ecc_rddn_addr_1 and ecc_rddn_addr_2, and then may store (rupture) the redundancy addresses ecc_rddn_addr_1 and ecc_rddn_addr_2 and the ECC information ecc_info_1 and ecc_info_2 in the redundancy address storage region 210 and the ECC information storage region 220 of the array electrical-fuse ARE. Then, when the redundancy addresses ecc_rddn_addr_1 and ecc_rddn_addr_2 of the redundancy address storage region 210 are accessed during an innovative refresh operation, the controller 140 may generate an error correction code using the redundancy addresses ecc_rddn_addr_1 and ecc_rddn_addr_2 and the corresponding ECC information ecc_info_1 and ecc_info_2 of the ECC information storage region 220. The controller 140 may correct the errors of the redundancy addresses ecc_rddn_addr_1 and ecc_rddn_addr_2 read from the redundancy address storage region 210 using the generated error correction code, and may generate the corrected redundancy addresses rddn_addr.

The error correction for the redundancy addresses ecc_rddn_addr_1 and ecc_rddn_addr_2 may be performed through a variety of publicly known methods, and the number of bits of the ECC information ecc_info_1 and ecc_info_2, that is, the address size (e.g., number of address bits) of the ECC information storage region 220 in the column direction may be set to various values according to the address size (e.g., number of address bits) of the redundancy addresses or an error correction method.

Although the redundancy addresses ecc_rddn_addr_1 and ecc_rddn_addr_2 are set to twelve (12) bits here, the number of bits of the redundancy addresses ecc_rddn_addr_1 and ecc_rddn_addr_2 may vary depending on the address size of the normal memory cells 110 in the column direction, that is, the number of address bits of the normal memory cells 100 in the column direction. Thus, the number of bits of the ECC information ecc_info_1 and ecc_info_2 may vary.

The IR address storage region 330 may store addresses ir_addr_1' and ir_addr_2' of weak cells, that is, IR addresses. When an active signal ACT corresponding to a refresh operation is input, the controller 140 may perform a refresh operation on the entire word lines of the normal memory cells 110, and then may additionally perform a refresh operation on word lines corresponding to the IR addresses ir_addr_1' and ir_addr_2' stored in the IR address storage region 330.

Here, the address size (e.g., the number of address bits) of the IR address storage region 330 in the column direction may be substantially equal to the address size (e.g., the number of address bits) of the redundancy address storage region 210 in the column direction.

The IR ECC information storage region 340 may store ECC information ir_ecc_info_1 and ir_ecc_info_2 corresponding to the IR addresses, that is, IR ECC information. As the ECC information ecc_info_1 and ecc_info_2 are generated in response to the redundancy addresses ecc_rddn_addr_1 and ecc_rddn_addr_2, the IR ECC information ir_ecc_info_1 and ir_ecc_info_2 may be generated in response to IR addresses ir_addr_1' and ir_addr_2', and the IR addresses ir_addr_1' and ir_addr_2' and the generated IR ECC information ir_ecc_info_1 and ir_ecc_info_2 may be stored (ruptured) in the IR address storage region 330 and the IR ECC information storage region 340, respectively.

However when the array electrical fuse ARE' having such a structure is used, the IR addresses ir_addr_1' and ir_addr_2' may become incorrect.

For example, when the address size of the normal memory cells 110 in the column direction is set to 8 k and the address size of the redundancy memory cells 120 in the column direction is set to 4 k, twelve (12) bits may be required for the redundancy addresses ecc_rddn_addr_1 and ecc_rddn_addr_2 because 4 k is $2^{12}$. Thus, the address size (e.g., number of address bits) of the redundancy address storage region 210 in the column direction may be set to twelve (12).

Furthermore, since the address size of the normal memory cells 110 in the column direction is set to 8 k and 8 k is $2^{13}$, thirteen (13) bits may be required for an address ADDR of the normal memory cells 110. Since the IR addresses ir_addr_1 and ir_addr_2 are addresses of weak cells among the normal memory cells 110, the IR addresses ir_addr_1 and ir_addr_2 need to be expressed as thirteen (13) bits, like the address ADDR of the normal memory cells 110.

As illustrated in FIG. 2, however, when the address size of the IR address storage region 330 in the column direction is set to be substantially equal to the address size of the redundancy address storage region 210 in the column direction, only the IR addresses ir_addr_1' and ir_addr_2' corresponding to the number of bits of the redundancy addresses ecc_rddn_addr_1 and ecc_rddn_addr_2 may be stored. Thus, an innovative refresh operation may be performed on the normal memory cells 110 as well as the weak cells.

For example, when only twelve (12) bits of the 13-bit IR addresses ir_addr_1 and ir_addr_2, corresponding to the number of bits of the redundancy addresses ecc_rddn_addr_1 and ecc_rddn_addr_2, are stored in the IR address storage region 330, the stored IR addresses ir_addr_1' and ir_addr_2' may indicate addresses of a weak cell and a normal memory cell which is not a weak cell. Thus, since the innovative refresh operation is performed on the normal memory cell as well as the weak cell, the refresh time may be increased.

In other words, when the redundancy addresses ecc_rddn_addr_1 and ecc_rddn_addr_2 have a smaller number of bits than the addresses ADDR of the normal memory cells 110, complete and accurate addresses of the normal memory cells 110 that are subject to the innovative refresh operation may not be stored. Thus, when the innovative refresh operation is performed, the innovative refresh operation may be performed on the normal memory cell 110 as well as the weak cell.

In an embodiment, the IR addresses ir_addr_1' and ir_addr_2' may have a larger number of bits than the redundancy addresses ecc_rddn_addr_1 and ecc_rddn_addr_2 to store a complete address for performing an innovative refresh operation.

Figure 3:
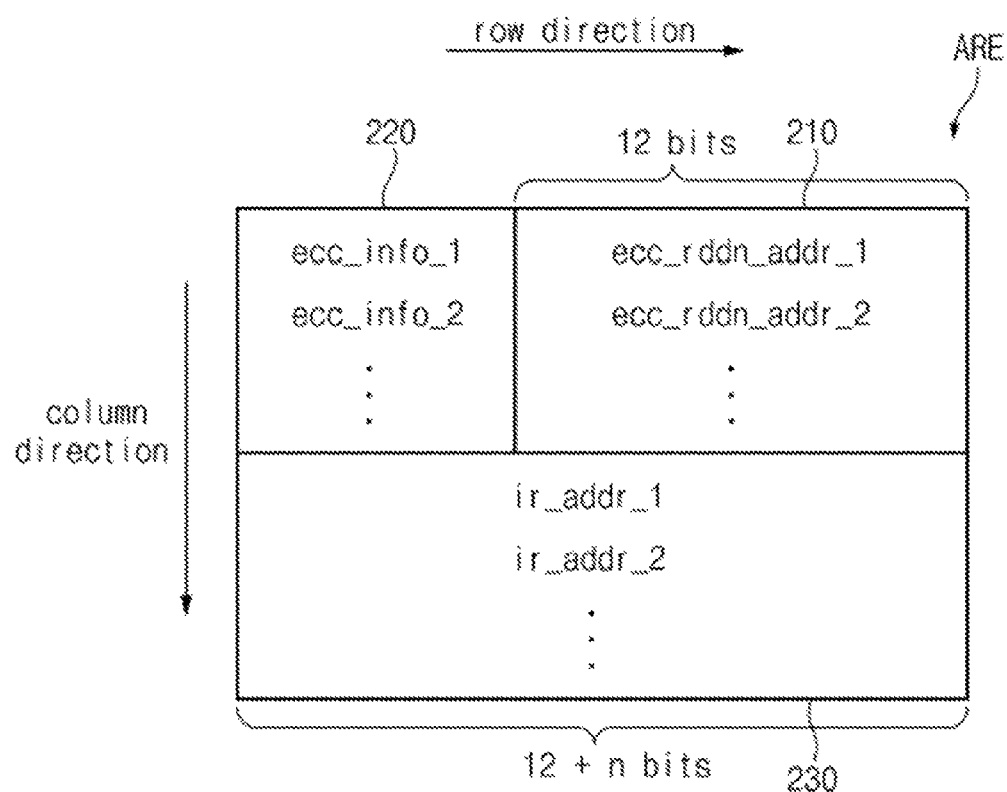
FIG. 3 is a diagram illustrating an example the array electrical-fuse of FIG. 1.

FIG. 3 is a diagram illustrating an example of the array electrical-fuse ARE of FIG. 1.

The array electrical-fuse ARE of FIG. 3 may include a redundancy address storage region 210, an ECC information storage region 220, and an IR address storage region 230.

The redundancy address storage region 210 and the ECC information storage region 220 of the array electrical-fuse ARE of FIG. 3 may have substantially the same configuration as the redundancy address storage region 210 and the ECC information storage region 220 of the array electrical-fuse ARE' of FIG. 2.

The IR address storage region 230 may store addresses ir_addr_1 and ir_addr_2 of weak cells, that is, IR addresses. In the array electrical-fuse ARE' of FIG. 2, the address size (number of bits) of the IR address storage region 330 in the column direction may be substantially equal to the address size (number of bits) of the redundancy address storage region 210 in the column direction. In the array electrical-fuse ARE of FIG. 3, however, the IR addresses ir_addr_1 and ir_addr_2 may have a larger number of bits than the redundancy addresses ecc_rddn_addr_1 and ecc_rddn_addr_2.

For example, the number of bits of the redundancy addresses ecc_rddn_addr_1 and ecc_rddn_addr_2 may be set to twelve (12), and the number of bits of the IR addresses ir_addr_1 and ir_addr_2 may be set to thirteen (13). In the array electrical-fuse ARE of FIG. 3, only the ECC information storage region 220 for correcting errors of the redundancy addresses ecc_rddn_addr_1 and ecc_rddn_addr_2 may be set, and an ECC information storage region for correcting errors of the IR addresses ir_addr_1 and ir_addr_2 may not be set. Thus, the number of bits of the IR addresses ir_addr_1 and ir_addr_2 stored in the array electrical-fuse ARE can be expanded without increasing the address size (number of address bits) of the array electrical-fuse ARE in the column direction. Therefore, it is possible to substantially prevent the innovative refresh operation from being performed on the normal memory cells 110.

Figure 4:
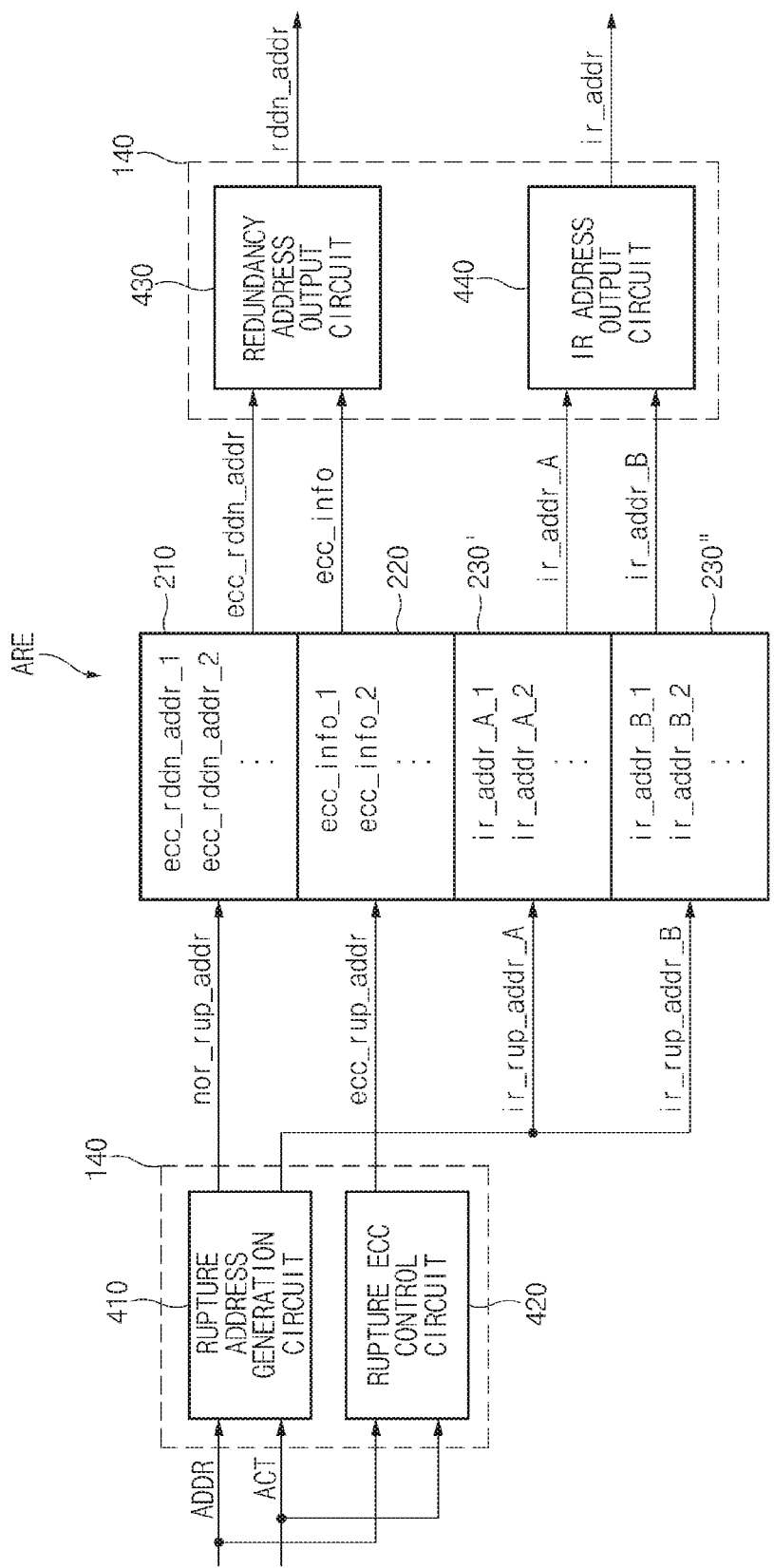
FIG. 4 is a diagram illustrating an example of a controller of FIG. 1.

FIG. 4 is a diagram illustrating an example of a signal flow between the controller 140 and the array electrical-fuse ARE.

Referring to FIG. 4, the semiconductor device according to an embodiment may include the array electrical-fuse ARE, a rupture address generation circuit 410, a rupture ECC control circuit 420, a redundancy address output circuit 430, and an IR address output circuit 440.

The array electrical-fuse ARE of FIG. 4 may correspond to the array electrical-fuse ARE of FIG. 2, and may include the redundancy address storage region 210, the ECC information storage region 220, an expanded IR address storage region 230' (expanded weak address storage region), and a basic IR address storage region 230" (basic weak address storage region). The array electrical-fuse ARE of FIG. 4 may correspond to the array electrical-fuse ARE of FIG. 2. The example configuration illustrated in FIG. 2 is provided for illustrative purposes only, and does not limit address sizes of the respective regions.

Since the redundancy address storage region 210 and the ECC information storage region 220 of the array electrical-fuse ARE in FIG. 4 correspond to the redundancy address storage region 210 and the ECC information storage region 220 of the array electrical-fuse ARE' in FIG. 2, the detailed descriptions thereof are omitted herein.

The expanded IR address storage region 230' and the basic IR address storage region 230" may be configured by dividing the IR address storage region 230 of FIG. 2. The address size (number of address bits) of the basic IR address storage region 230" in the column direction in FIG. 4 may be substantially equal to the number of bits of the redundancy addresses ecc_rddn_addr_1 and ecc_rddn_addr_2 in FIG. 2, and the address size (number of bits) of the expanded IR address storage region 230" in the column direction in FIG. 4 may be substantially equal to the number of bits of the ECC information ecc_info_1 and ecc_info_2 in FIG. 2.

The rupture address generation circuit 410, the rupture ECC control circuit 420, the redundancy address output circuit 430 and the IR address output circuit 440 may correspond to the controller 140 of FIG. 1.

When an input address ADDR is a failed address, the rupture address generation circuit 410 may calculate a normal rupture address nor_rup_addr of the redundancy address storage region 210, in order to acquire a redundancy address ecc_rddn_addr corresponding to the failed address.

Furthermore, the rupture address generation circuit 410 may generate IR rupture addresses ir_rup_addr_A and ir_rup_addr_B for accessing the expanded IR address storage region 230' and the basic IR address storage region 230" of the array electrical-fuse ARE, in order to acquire IR addresses ir_addr_A and ir_addr_B during an innovative refresh operation.

When the input address ADDR is a failed address, the rupture ECC control circuit 420 may generate an ECC rupture address ecc_rup_addr of the ECC information storage region 220, in order to acquire ECC information ecc_info for correcting an error of the redundancy address ecc_rddn_addr corresponding to the failed address.

When the innovative refresh operation is performed, the rupture ECC control circuit 420 may not perform an error correction operation on the IR addresses ir_addr_A and ir_addr_B.

The redundancy address output circuit 430 may correct an error of the redundancy address ecc_rddn_addr output from the redundancy address storage region 210 using the ECC information ecc_info output from the ECC information storage region 220, and output the corrected redundancy address rddn_addr.

The IR address output circuit 440 may combine an expanded IR address ir_addr_A output from the expanded IR address storage region 230' and a basic IR address ir_addr_B output from the basic IR address storage region 230", and output an IR address ir_addr.

The technical idea of the present disclosure has been described in detail with reference to the embodiments, but the scope of the present disclosure is not limited thereto. A person of ordinary skill in the art can fully modify and apply the various cases adopting the technical idea of the present invention based on the detailed description and the example embodiments.

For example, unlike the single-bank normal memory cells 110 discussed above, the normal memory cells 110 in an embodiment may be divided into a plurality of banks.

Figure 5:
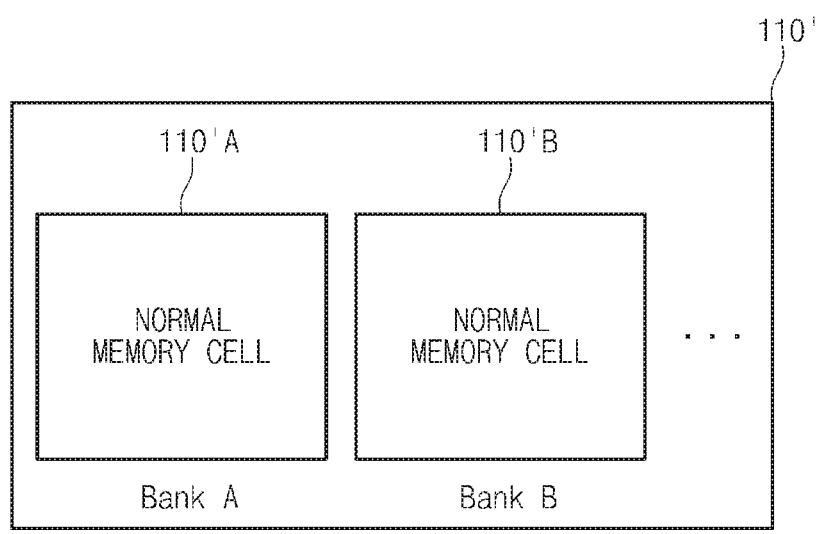
FIG. 5 is a diagram illustrating an example architecture of normal memory cells according to an embodiment.

FIG. 5 is a diagram illustrating an example architecture of the normal memory cells according to an embodiment.

The normal memory cells 110' of FIG. 5 may be divided into a bank A having normal memory cells 110A and a bank B having normal memory cells 110B.

In this case, IR addresses ir_addr_1 and ir_addr_2 may be stored for the respective banks. For example, IR addresses of the bank A may be stored in first to $n^{th}$ rows of the IR address storage region 230, and IR addresses of the bank B may be stored in $(n+1)^{th}$ to $2n^{th}$ rows of the IR address storage region 230.

However, since the IR addresses are stored in such a manner, the address size of the IR address storage region 230 in the column direction may be increased. Here, if an unused region (bit) of the IR address storage region 230 is used to store a bank address, the address size of the IR address storage region 230 in the column direction may not be increased. For example, when one of the most significant bits of the IR address storage region 230 is not used, the bank address may be represented by the most significant bit of the IR address storage region 230.

Furthermore, the IR ECC information ir_ecc_info_1 and ir_ecc_info_2 may not be stored in the IR address storage region 230, but only the IR addresses ir_addr_1 and ir_addr_2 may be stored in the IR address storage region 230. Here, an error correction operation may not be performed on the IR addresses ir_addr_1 and ir_addr_2. Alternatively, an error correction operation may be performed on the IR addresses.

Specifically, information for correcting errors of the IR addresses may be stored in the unused area of the IR address storage region 230. When the unused area of the IR address storage region 230 has an insufficient size in storing the information for correcting errors of the IR addresses, information having a smaller number of bits for simply checking whether an error occurred may be stored in the unused area, in order to check whether an error occurred in the IR addresses ir_addr_1 and ir_addr_2 stored in the IR address storage region 230.

According to various embodiments of the present disclosure, the semiconductor device can store a complete weak cell address without increasing the size of memory cells for storing addresses, such as redundancy memory cells or ARE. Thus, the semiconductor device can reduce an unnecessary refresh operation, thereby improving performance while minimizing power consumption.

While certain embodiments have been described above, it will be understood to those skilled in the art that the embodiments described are by way of example only. Accordingly, the semiconductor device described herein should not be limited based on the described embodiments. Rather, the semiconductor device described herein should only be limited in light of the claims that follow when taken in conjunction with the above description and accompanying drawings.

What is claimed is:

1. A semiconductor device comprising:
   normal memory cells;
   redundancy memory cells configured to replace one or more normal memory cells;
   a fuse array comprising:
      a redundancy address storage region configured to store addresses of the redundancy memory cells,
      an error correction information storage region configured to store error correction information for correcting errors of addresses of the redundancy memory cells, stored in the redundancy address storage region, and
      a weak address storage region configured to store an address of a weak cell among the normal memory cells; and
   a controller configured to perform a repair operation based on the addresses of the redundancy memory cells, stored in the redundancy address storage region, and perform a refresh operation on the weak cell,
   wherein the weak address storage region comprises:
   a basic weak address storage region configured to have substantially the same number of address bits as the redundancy address storage region; and
   an expanded weak address storage region provided in addition to the basic weak address storage region.

2. The semiconductor device according to claim 1, wherein the fuse array comprises an array electrical-fuse (ARE).

3. The semiconductor device according to claim 1, wherein the weak address storage region has a larger number of address bits than the redundancy address storage region.

4. The semiconductor device according to claim 3, wherein a number of address bits of the weak address storage region is smaller than a sum of a number of address bits of the error correction information storage region and a number of address bits of the redundancy address storage region.

5. The semiconductor device according to claim 1, wherein the controller comprises a rupture address generation circuit configured to, when an input address is a failed address, generate a rupture redundancy address corresponding to the input address and access the redundancy address storage region corresponding to the generated rupture redundancy address.

6. The semiconductor device according to claim 5, wherein the controller comprises a rupture ECC control circuit configured to, when the input address is a failed address, generate a rupture error correction information address corresponding to the input address and access the error correction information storage region corresponding to the generated rupture error correction information address.

7. The semiconductor device according to claim 1, wherein the controller accesses the basic weak address storage region and the expanded weak address storage region in response to a refresh command, and acquires the address of the weak cell by combining information read from the basic weak address storage region and information read from the expanded weak address storage region.

8. The semiconductor device according to claim 7, wherein, when an input address is a failed address, the controller generates a rupture redundancy address using a value obtained by excluding successive n bits of the input address, and accesses the redundancy address storage region corresponding to the generated rupture redundancy address.

9. The semiconductor device according to claim 1, wherein a ratio of the number of word lines included in the normal memory cells and the number of word lines included in the redundancy memory cells is set to $2^n:1$ (where n is an integer equal to or more than 1).

10. The semiconductor device according to claim 9, wherein the number of address bits of the weak address storage region is larger by n than the number of address bits of the redundancy address storage region.

11. The semiconductor device according to claim 9, wherein the weak address storage region comprises:
   a basic weak address storage region having substantially the same number of address bits as the redundancy address storage region; and
   an expanded weak address storage region provided in addition to the basic weak address storage region and having a number of address bits of n.

12. The semiconductor device according to claim 1, wherein the controller performs the refresh operation on the normal memory cells in response to a refresh command, and additionally performs the refresh operation on the weak cell corresponding to the address of the weak cell, stored in the weak address storage region.

13. The semiconductor device according to claim 1, wherein an array of the normal memory cells is split into a plurality of banks.

14. The semiconductor device according to claim 13, wherein the weak address storage region stores a bank address indicating which bank, out of the plurality of banks, the weak cell belongs to.

15. The semiconductor device according to claim 1, wherein the controller does not perform an error correction operation on the weak cell, the address of the weak cell being stored in the weak address storage region.

16. A semiconductor device comprising:
   normal memory cells;
   redundancy memory cells configured to replace one or more normal memory cells;
   a fuse array extending in a row direction and in a column direction, the fuse array comprising:
      a redundancy address storage region configured to store addresses of the redundancy memory cells, wherein address bits corresponding to each of the addresses of the redundancy memory cells are arranged in the row direction,
      an error correction information storage region configured to store error correction codes for correcting errors of the addresses of the redundancy memory cells, stored in the redundancy address storage region, and
      a weak address storage region configured to store addresses of weak cells among the normal memory cells, wherein address bits corresponding to each of the addresses of weak cells are arranged in the row direction; and
   a controller configured to perform a repair operation based on the addresses of the redundancy memory cells, stored in the redundancy address storage region, and perform a refresh operation on the weak cell,
   wherein a basic weak address storage region, which is a first part of the weak address storage region in the row direction, is arranged to correspond to the redundancy address storage region, and
   wherein an expanded weak address storage region, which is a second part of the weak address storage region in the row direction, is arranged to correspond to the error correction information storage region.

17. The semiconductor device according to claim 16, wherein the basic weak address storage region has substantially the same number of address bits in the row direction as the redundancy address storage region.

* * * * *